United States Patent [19]

Kondo et al.

[11] Patent Number: 4,599,295
[45] Date of Patent: Jul. 8, 1986

[54] PHOTOSENSITIVE MATERIAL WITH TWO PHOTOSENSITIVE LAYERS FOR FORMING SEPARATE IMAGED ELEMENTS

[75] Inventors: Syuzi Kondo; Akira Yamano; Keiji Toei, all of Kyoto, Japan

[73] Assignee: Dainippon Screen Seizo K.K., Japan

[21] Appl. No.: 532,105

[22] Filed: Sep. 14, 1983

[30] Foreign Application Priority Data

Oct. 7, 1982 [JP] Japan .................. 57-176758

[51] Int. Cl.$^4$ .................. G03C 1/46; G03C 1/52; G03C 1/71
[52] U.S. Cl. .................. 430/156; 430/143; 430/145; 430/155; 430/260; 430/261; 430/270; 430/271; 430/257; 430/258; 430/5; 430/302
[58] Field of Search .................. 430/156, 155, 143, 145, 430/270, 271, 260, 261, 257, 258

[56] References Cited

U.S. PATENT DOCUMENTS

| | | | |
|---|---|---|---|
| 2,409,564 | 10/1946 | Heinecke et al. | 430/260 |
| 2,528,395 | 10/1950 | Slifkin | 430/260 |
| 2,609,291 | 9/1952 | Coote et al. | 430/261 |
| 2,702,243 | 2/1955 | Schmidt | 430/156 |
| 3,671,236 | 6/1972 | Van Beusekom | 430/143 |
| 4,050,936 | 9/1977 | Takeda et al. | 430/253 |
| 4,256,825 | 3/1981 | Loprest | 430/156 |
| 4,299,912 | 11/1981 | Shiba et al. | 430/156 |
| 4,347,300 | 8/1982 | Shimazu et al. | 430/156 |
| 4,389,473 | 6/1983 | Scrutton et al. | 430/260 |

FOREIGN PATENT DOCUMENTS

| | | | |
|---|---|---|---|
| 986773 | 4/1976 | Canada | 430/155 |
| 47-16083 | 5/1972 | Japan | 430/260 |
| 1546753 | 5/1979 | United Kingdom | 430/260 |

OTHER PUBLICATIONS

Nakayama, T. et al., *Photo Sci. Eng.*, vol. 22, No. 3, 5-6/1978, pp. 137-141.

Primary Examiner—Charles L. Bowers, Jr.

[57] ABSTRACT

Disclosed is a photosensitive material which has a first photosensitive layer formed on a support body such as an aluminum plate, a peel-off layer thereon and a second photosensitive layer formed on the peel-off layer in such a manner that the second layer can be photographically exposed to light and photographically developed independently from the first photosensitive layer and the first photosensitive layer may be subsequently photographically exposed with the picture image formed on the second photosensitive layer acting as a photographic mask. After the first photosensitive layer has been photographically developed, the two photosensitive layers may be used for different purposes, for instance, using the first photosensitive layer as a printing plate and the second photosensitive layer as a photographic film for making duplicate printing plates. Since the first photosensitive layer may be photographically exposed with uncontrolled light while the second photosensitive layer may be photographically exposed with a laser beam of small intensity, this photosensitive material is highly useful for use on a scanning image processing device. Also, a method of conveniently utilizing the photosensitive material is additionally disclosed.

7 Claims, 5 Drawing Figures

PHOTOSENSITIVE MATERIAL WITH TWO PHOTOSENSITIVE LAYERS FOR FORMING SEPARATE IMAGED ELEMENTS

This invention relates to a photosensitive material having a multi-layered structure and a plate-making method utilizing the same, and in particular to a photosensitive material having a multi-layered structure in such a manner that a plurality of photosensitive layers may be conveniently photographically exposed with only the topmost layer being photographically scanned or photographically exposed in a controlled manner while an inner layer is simply photographically exposed using the topmost layer as a photographic mask so that the photosensitive layers may be utilized for different purposes and a plate-making method which makes use of such a photosensitive material.

In recent years, with the development of computer-controlled digital image processing, some picture image scanning devices which can make printing plates without requiring any intermediate photographic original plate or which can offer the so-called direct plate-making have been made public and some of them have already been put into practical use.

In such a picture image scanning recording device, a laser beam is commonly used as a recording light beam for achieving the photographic exposure through scanning. A photosensitive lithographic printing plate material of relatively low sensitivity is often the medium for picture image reproduction, and, therefore, either a laser beam of a high intensity or a long photographic exposure time has been necessary.

Normally, a photosensitive lithographic printing plate is comprised of a non silver salt photosensitive layer, typically made of a diazo or azido material, formed on a support body such as an aluminum plate. The picture image is insoluble to water and has an affinity for oil while the aluminum plate has an affinity for water. Such a photosensitive material has a wave length sensitivity range which may not be in agreement with the wave length of the laser beam.

To eliminate this inconvenience, it has been proposed British Pat. No. 122603 to make use of a photosensitive printing plate material which is additionally provided with a silver halide photosensitive layer on top of the non silver salt photosensitive layer.

According to such a known photosensitive lithographic printing plate material, the silver halide photosensitive layer is first photographically exposed with a controlled laser beam and then photographically developed so as to form a silver picture image. Thereafter, an ultraviolet beam of a sufficient intensity is evenly radiated onto the non silver salt photosensitive layer with the silver picture image acting as a photographic mask. The silver picture image is removed by dissolution and the non silver halide photosensitive layer is photographically developed so that it may serve as a finally prepared printing plate having the same or the completely reversed picture image as that formed on the silver halide photosensitive layer.

With the introduction of such a photosensitive lithographic printing plate material having a silver halide photosensitive layer on top of a non silver salt photosensitive layer, it has become possible to record a picture image directly on a photosensitive lithographic printing plate with a picture image scanning device without the use of an intermediate photographic film original plate.

However, according to such a process of making a printing plate, there are some inconveniences such that, when a plurality of same printing plates are needed at the same time or after a certain time period, a relatively expensive picture image scanning device has to be used repeatedly until the desired number of printing plates are obtained due to the absence of an intermediate photographic film original plate, causing considerable losses in time and cost.

In view of such inconveniences and shortcomings of conventional photographic materials, a primary object of this invention is to provide a photosensitive material which may be used for more than purpose, typically as a printing plate and a photographic film original plate which may be used for duplicating the printing plate, allowing the recording of a printing plate picture image in a relatively short time period through scanning type photographic exposure with a laser beam of a relatively low intensity and offering a photographic film original plate at the same time.

Another object of this invention is to provide a plate-making method which conveniently make use of such a photosensitive material.

According to this invention, such objects are accomplished by providing a photosensitive material having a multi-layered structure, comprising a support body, a first photosensitive layer formed on the support body, a transparent or semi-transparent peel-off layer formed on the first photosensitive layer, and a second photosensitive layer formed on the peel-off layer, in such a manner that the second photosensitive layer may be photographically exposed and developed, and the first photosensitive layer may be photographically exposed with the second photosensitive layer acting as a photographic mask. After the photographic development of the second photosensitive layer, the second photosensitive layer may be peeled-off from the first photosensitive layer at the peel-off layer for separate use. Also provided is a plate-making method which is characterized by the steps of forming a first photosensitive layer, a peel-off layer and a second photosensitive layer, photographically exposing the second photosensitive layer, photographically developing the second photosensitive layer, photographically exposing the first photosensitive layer with the second photosensitive layer acting as a photographic mask, adhering a transparent or semi-transparent support sheet over the second photosensitive layer, peeling off the second photosensitive layer along with the support sheet from the first photosensitive layer, and photographically developing the first photosensitive layer.

The invention is described below with reference made to the appended drawings in which:

FIG. 1 is a sectional view of an embodiment of the photosensitive material of this invention and, in this instance, the photosensitive material is intended for use as a lithographic printing plate and a photographic film original plate.

Figure 1:
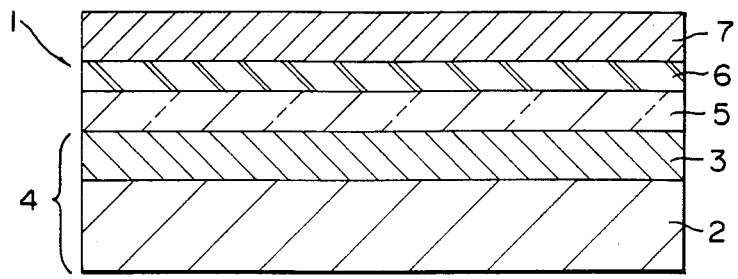
FIG. 1 is a sectional view of an embodiment of the photosensitive material having a multi-layered structure according to this invention.

The photosensitive material 1 of this embodiment is comprised of a known photosensitive lithographic printing plate material 4 having a non silver salt photosensitive layer 3 which may be made of such materials as diazo and azido photosensitive resins which can form a picture image having an affinity for oil and which is insoluble to water, as a first photosensitive layer on a support body 2 such as an aluminum plate which is so surface processed as to have an affinity for water, and a peel-off layer 5, a barrier layer 6 and a second photosensitive layer consisting of a silver halide photosensitive layer 7, in that order.

The peel-off layer 5 may be a layer of polyvinyl alcohol (which is referred to as PVA hereinafter), for example. The barrier layer 6 is provided for the purpose of protecting the non silver salt photosensitive layer 3 when photographically developing the silver halide photosensitive layer 7 and may be a layer consisting of Melcoat Clear (Trade name: Washin Kagaku K.K., Japan) prepared by dissolving a copolymer of vinylcholoride, and vinylacetate in a solvent mixture comprising a ketone compound and an aromatic hydrocarbon compound.

The thicknesses of the peel-off layer 5 and the barrier layer 6 are desirably from 0.2 to 30 micrometers and their materials are not limited to those mentioned above as will be described in detail hereinafter. According to this embodiment, the silver halide photosensitive layer 7 may be a known silver halide photosensitive agent.

Next is described a process of plate making which makes use of the above described photosensitive material 1.

First, a picture image is photographically exposed onto a photosensitive material 1 with a picture image scanning recording device such as a color scanner and is photographically developed. A silver picture image corresponding to the latent image exposed onto the silver halide photosensitive layer 7 is formed.

Figure 2:
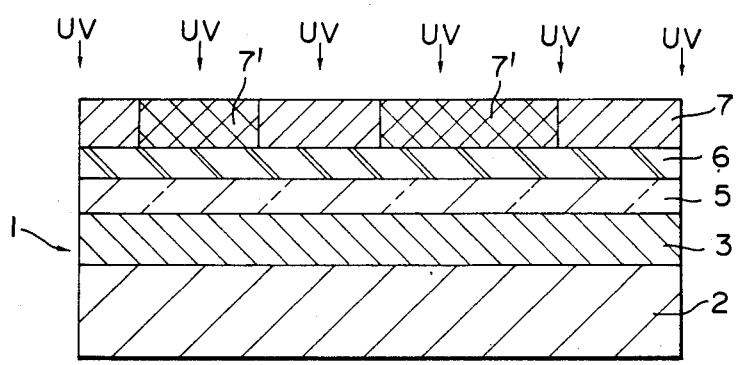
FIG. 2 is a view similar to FIG. 1 showing the photosensitive material of FIG. 1 when it is being photographically exposed.

Next, ultraviolet light (UV) is radiated uniformly over the silver halide photosensitive layer 7 after it has been photographically developed. The non picture image portion thereof is photographically exposed to the non silver halide photosensitive layer 3 with the picture image portion 7' of the silver halide photosensitive layer 7 acting as a photographic mask as shown in FIG. 2.

Figure 3:
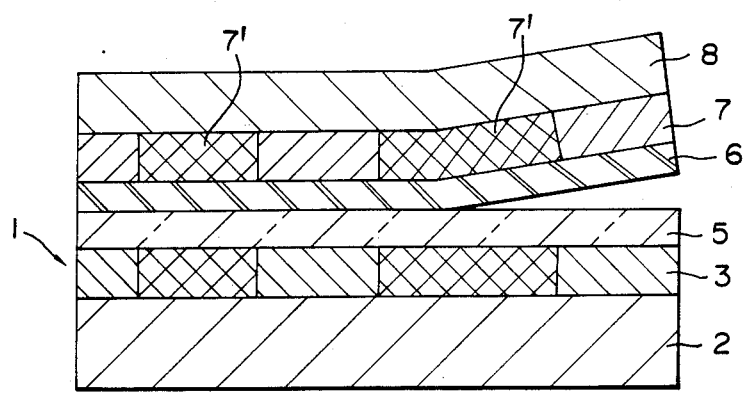
FIG. 3 is a view similar to FIG. 1 showing the photosensitive material of FIG. 1 when it is being peeled-off after being photographically exposed.

Thereafter, a support sheet 8 made of a transparent or semi-transparent sheet material such as a polyester film is attached over the silver halide photosensitive layer 7 as shown in FIG. 3 and as will be described in detail hereinafter, and the silver halide photosensitive layer 7 is peeled off at the boundary between the peel-off layer 5 and the barrier layer 6 with the silver halide photosensitive layer 7 attached to the support sheet 8.

The silver salt photosensitive layer 3 may be developed by using water, for the layer 3 produces picture images which are water-insoluble by exposure, and in the range of its non-exposed area it remains water solubility. Accordingly, quite the same treatment as those having been practised in processing the usual photosensitive materials may be applied.

Lastly, after removing the peel-off layer 5 that is still attached to the non-silver salt photosensitive layer 3, the non silver salt photosensitive layer 3 is photographically developed and a printing plate having a desired picture image is formed in the non silver salt photosensitive layer 3 on the support body 2, on one hand, while a photographic film original plate is obtained in the silver halide photosensitive layer 7 (either negative or positive) on the support sheet 8.

The barrier layer 6 is provided for the purpose of preventing the processing fluid for photographically developing the silver halide photosensitive layer 7 from affecting the peel-off layer 5 and the non silver salt photosensitive layer 3 and, for instance, Melcoat Clear (Trade name: Washin Kagaku K.K., Japan) may be used for forming a water-resistant transparent film.

For increasing the affinity of the barrier layer 6 for the silver halide photosensitive layer 7, a surface activating agent such as Surflon (Trade name: Asahi Glass K.K., Japan) is coated on the barrier layer 6. However, the surface activating agent is not limited to this particular one.

The peel-off layer 5 is basically provided for the purpose of allowing the non silver salt photosensitive layer 3 and the silver halide photosentive layer 7 to be mutually separable and the reason for the use of PVA in the previous embodiment was because PVA is soluble to water while the non silver salt photosensitive layer 3 and the barrier layer 6 are both insoluble to water, and these properties facilitate the separation of the two layers. Therefore, other materials such as gelatine may be use instead of PVA.

The support sheet 8 in the previous embodiment was made of a polyester film but is not limited to that selection. Any support sheet is the form of transparent or semi-transparent sheet material which is commonly used as a support body for normal photosensitive film, such as a polyethylene or polyester film sheet, is also usable.

Adhe Series #25 (Trade name: Sanken Kagaku K.K., Japan) was used in adhering the support sheet 8 to the silver halide photosensitive layer 7 as an adhesive agent but may well be other adhesive agents which do not adversely affect the silver halide photosensitive layer 7 and have a high level of transparent for ultraviolet light.

It is desirable after the adhesion of the support sheet 8 coated with the adhesive agent to use a pair of pressure rollers for completing the adhesion process.

Figure 4:
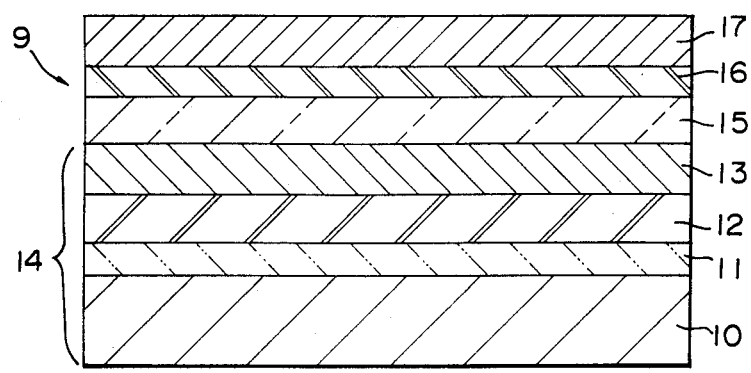
FIG. 4 is a view similar to FIG. 1 showing another embodiment of the photosensitive material according to this invention.

FIG. 4 is a sectional view showing another embodiment of the photosensitive material according to this invention in which the photosensitive material is both a dyed film for color correction and a photographic film original plate.

This photosensitive material 9 is comprised of a known, so-called post dying type color correction film 14 which has, on a support body 10 made of a polyester film, an anchor layer 11, a dyed layer 12 and a non silver salt photosensitive layer 13 such as a diazo photosensitive resin which can form a water-resistant picture image, as a first photosensitive layer, a peel-off layer 15 a barrier layer 16 and silver halide photosensitive layer 17 as a second photosensitive layer.

The above-described film 14 for color correction may also be so-called pre dyed type film for color correction which, having no dyed layer, can be dyed to a desired color later and can form a picture image which is insoluble either to water or to oil.

The peel-off layer 15, the barrier layer 16, the silver halide photosensitive layer 17 and the support sheet 18 which carries these layers may be identical to those in the previously-described first embodiment.

The plate-making method utilizing this photosensitive material 9 is similar to that of the first embodiment but is slightly different in the following respects.

Figure 5:
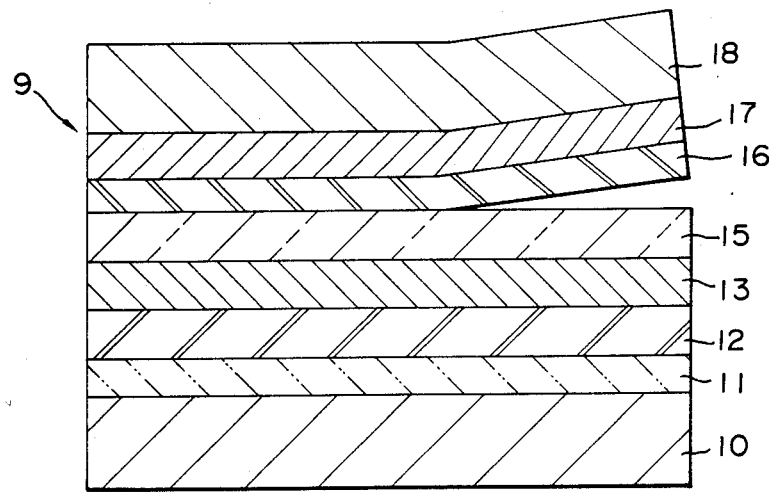
FIG. 5 is a view similar to FIG. 3 showing the photosensitive material of FIG. 4 as it is being peeled-off, to illustrate the plate-making method according to this invention.

Namely, after the support sheet 18 is adhered onto the silver halide photosensitive layer 17 and the silver halide photosensitive layer 17 is peeled off at the boundary between the peel-off layer 15 and the barrier layer 16 as illustrated in FIG. 5, the barrier layer 15 is removed and the non silver salt photosensitive layer 13 is photographically developed, followed by the process of dying the dyed layer 12 using the non picture image portion formed on the non silver salt photosensitive layer 13 as a dying mask in the same way as processing a normal post dying type film for color correction.

Thus, a film for color correction having a dyed picture image on the support body 10 and a photographic film picture original plate having a desired, duplicate picture image on the support sheet 18 are both obtained. The photographic film original plate may also be used for obtaining a desired printing plate by closely contacting it to a photosensitive printing plate material and photographically exposing it.

In particular, color separation is to be made on a color scanner, and negative or positive color separation films are obtained simultaneous as dyed films for color correction are obtained, offering the great convenience that the quality of the color separation may be confirmed immediately.

As is apparent from the above-described two embodiments, the barrier layers 5 and 15 are provided for allowing the second photosensitive layers (the silver halide photosensitive layers 7 and 17) to be separated from the first photosensitive layers (the non silver salt photosensitive layers 3 and 13) without damaging them. Therefore, the barrier layers may be made of any material as long as it can serve such a purpose and, for instance, a material which is soluble to oil, instead of PVA, should be used if the barrier layers 6 and 16 and the non silver salt photosensitive layers 3 and 13 both have an affinity for water.

The barrier layers 6 and 16 were provided for the purpose of preventing the photographic developing fluid for photographically developing the second photosensitive layers such as the silver halide photosensitive layers 7 and 17 from adversely affecting the first photosensitive layers such as the non silver salt photosensitive layers 3 and 13, and, if the photographic developing fluid does not cause such an adverse effect, may not be provided at all.

Also, if the peel-off layer 5 or 15 provides the function of a barrier layer, the barrier layers 6 and 16 may be eliminated. At any event, the peel-off layers 5 and 15 and the barrier layers 6 and 16 are, no matter what sort of material they are made from, required to have a sufficient transparency for the light used for photographic exposure.

The photosensitive material according to this invention is not limited to the above embodiments but may also be such ones as a photosensitive printing plate material having a photosensitive layer of a photosensitive agent other than a diazo photosensitive layer and a photosensitive material in which a silver halide photosensitive layer or other photosensitive layer is formed on a photosensitive film material with a barrier layer interposed therebetween, and the first and the second photosensitive layers may be either positive or negative ones.

As described above, this invention is comprised of providing, for instance, a silver halide photosensitive layer as a second photosensitive layer of, for instance, a known photosensitive lithographic printing plate material or a known film material for color correction, according to the particular application, adhering a support sheet such as a polyester film for the second photosensitive layer after completion of the photographic exposure of the first and the second photosensitive layers, and peeling off the second photosensitive layer at the peel-off layer.

Therefore, according to the photosensitive lithographic printing plate material 1 described in conjunction with the first embodiment, direct photographic exposure at a relatively high speed becomes possible with the use of a picture image scanning recording device equipped with a relatively low-power laser and a photographic film plate is obtained at the same time in addition to the printing plate so that a plurality of duplicate printing plates may be prepared from this photographic film original plate through contact exposure in a short time period.

Furthermore, according to the second embodiment, a film for color correction may be directly photographically exposed with a picture image scanning recording device and a photographic film original plate may be obtained at the same time. Therefore, as compared with the conventional process of preparing only a photographic film original plate first and then making a film for color correction through contact exposure of the photographic film original plate, both a film for color correction and a photographic film original plate may be obtained with fewer steps and in a shorter time period.

Thus, the present invention has numerous practical advantages such that two photographic materials which may be used for different purposes may be obtained simultaneously by forming a first and a second photosensitive layers with a barrier layer interposed therebetween.

Although the present invention was described above in terms of specific embodiments, it is obvious to a person skilled in the art that various modifications and replacement are possible in the actual implementation of the invention without departing from the spirit of this invention which is set out in the appended claims.

We claim:
1. A photosensitive material having a multi-layered structure comprising:
   a support body;
   a first photosensitive layer of non-silver salt photosensitive material formed on the support body;
   a peel-off transparent or semi-transparent layer formed on the first photosensitive layer and removably adherent thereto;
   a barrier layer for protecting the first photosensitive layer when a second photosensitive layer is developed removably laminated to the peel-off layer; and
   a second photosensitive layer comprising a silver halide photosensitive material on the barrier layer;
   whereby after picture images have been formed on the first and second photosensitive layers, the photosensitive layers can be separated between the peel-off layer and barrier layer so that each photosensitive layer is utilizable for different purposes.

2. A photosensitive material having a multi-layered structure as defined in claim 1, wherein the first photosensitive layer is a diazo or azido photosensitive layer which is adapted to be photographically exposed after it has been photographically developed to act as a photographic mask.

3. A photosensitive material having a multi-layered structure as defined in claim 2, wherein the second photosensitive layer is adapted to act as a dye mask for selective dyeing of an additional layer which is interposed between the first photosensitive layer and the support body.

4. A photosensitive material having a multi-layered structure as defined in claim 1, wherein the first photosensitive layer is adapted to be used as a printing plate.

5. A photosensitive material having a multi-layered structure as defined in claim 1, wherein the first photosensitive layer is adapted to be used as a printing plate while the second photosensitive layer is adapted to be used as a photographic film original plate for producing a duplicate printing plate or a film for color correction.

6. A photosensitive material having a multi-layered structure as defined in claim 1, wherein the first photosensitive layer is adapted to be used as a film for color correction in a color separation process while the second photosensitive layer is adapted to be used as a photographic film original plate for producing a duplicate color correction film or a printing plate.

7. A photosensitive material having a multi-layered structure as defined in claim 1, wherein the first photosensitive layer is non silver salt photosensitive material layer which can reproduce water insoluble picture images by photographical exposure, and can be developed by water after the second photosensitive layer has been peeled-off.

* * * * *